United States Patent [19]

Huebner et al.

[11] Patent Number: 4,688,017

[45] Date of Patent: Aug. 18, 1987

[54] OPTICAL DETECTOR CIRCUIT FOR PHOTOMETRIC INSTRUMENT

[75] Inventors: Victor R. Huebner, Newtown Square; Scott K. Hartman, Philadelphia, both of Pa.

[73] Assignee: CooperBiomedical, Inc., Malvern, Pa.

[21] Appl. No.: 864,852

[22] Filed: May 20, 1986

[51] Int. Cl.⁴ .............................................. H03M 1/52
[52] U.S. Cl. ............................. 340/347 NT; 356/339
[58] Field of Search ................ 340/347 NT, 347 AD, 340/347 CC; 356/339; 324/99 D

[56] References Cited

U.S. PATENT DOCUMENTS

| | | | |
|---|---|---|---|
| 3,526,888 | 9/1970 | Knox et al. | 340/347 |
| 3,577,140 | 5/1971 | Aashaes | 340/347 |
| 3,696,403 | 10/1972 | DiRocco | 340/347 |
| 3,702,146 | 10/1972 | Haga et al. | 340/347 |
| 3,733,600 | 5/1973 | Hellwarth | 340/347 NT |
| 3,747,089 | 7/1973 | Sharples | 340/347 |
| 3,967,901 | 7/1976 | Rodriguez | 356/103 |
| 4,024,533 | 5/1977 | Neumann | 340/347 NT |
| 4,337,456 | 6/1982 | Deffendall | 340/347 NT |
| 4,379,260 | 4/1983 | Labus | 324/99 |
| 4,395,665 | 12/1983 | Achter et al. | 356/339 |

OTHER PUBLICATIONS

Chapter of *Fundamentals of Clinical Chemistry*.

Primary Examiner—Charles D. Miller
Attorney, Agent, or Firm—Vorys, Sater, Seymour & Pease

[57] ABSTRACT

An optical detector circuit for a photometric instrument for providing a high precision, low cost A/D conversion of a detected optical signal. A sampled signal is integrated in a sample signal integrator while a reference signal integrator is integrated in a reference signal integrator. Using dual slope techniques, the integrated reference signal is provided as an input signal to the sample signal integrator during a de-integration cycle to provide a ratio of the detected signal to the reference signal, useful in nephelometers. An inverted blanking signal may also be integrated in the sample integrator prior to an integration of the sample signal to improve the accuracy of the dual slope integration. The period of integration is selected as a multiple of the primary sources of interfering noise such as power line and flourescent light frequencies.

13 Claims, 5 Drawing Figures

OPTICAL DETECTOR CIRCUIT FOR PHOTOMETRIC INSTRUMENT

BACKGROUND OF THE INVENTION

This invention relates to an optical detector circuit for a photometric instrument. More particularly, this invention relates to an optical detector circuit providing a high precision A/D conversion of a detected optical signal with an improved signal to noise ratio and enhanced interference characteristics. Still more particularly, this invention relates to an optical detection circuit using dual slope integration through a programmed sequence comprising a discharge cycle wherein a reference signal and a true signal are discharged to a zero level, a zero blanking cycle through which an inverted blanking signal is integrated, a measuring cycle in which both the reference signal and the true signal are integrated, and a deintegration or counting cycle during which the ratio between the integrated reference signal and the integrated measured signal is digitally counted.

Photometric instruments are known to the art for providing an analog signal representative of an optical characteristic of a sample of interest to an investigator. Among such instruments are spectrophotometers, nephelometers, and fluorimeters. Such instruments provide an analog output signal which is digitally converted in an A/D converter for measurement of the magnitude of a light-related signal as an indicator of a parameter in a measured sample which is of interest.

A number of instruments are known which use dual slope integration techniques in an analog to digital conversion in which an unknown analog signal is integrated for a fixed time period and subsequently related to integration of a reference voltage wherein digital conversion occurs through pulses gated through a pulse counter.

In such devices, it is a consistent problem in the art to develop an instrument which exhibits superior noise and interference rejection characteristics. Accordingly, it is an object of the invention to provide an optical detector circuit which exhibits an improved signal-to-noise ratio through a technique of time integration of the true signal and a blank reference signal.

It is another object of this invention to provide an improved optical detector circuit with improved interference rejection characteristics by choosing an integration period as a precise multiple of the primary sources of interference, such as power line frequencies and fluorescent light frequencies.

It is still another object of this invention to provide a high precision A/D conversion of the integrated signal for a ratioed signal representative of a detected reference signal and a detected sample signal through a controlled program comprising a discharge cycle, a zero blanking cycle, a measuring cycle and a deintegration or counting cycle.

These and other objects of the invention will become apparent from the detailed description of the invention which follows in conjunction with the accompanying drawings.

BRIEF SUMMARY OF THE INVENTION

Directed to achieving the foregoing objects and overcoming the problems with the known art, the invention comprises a method and apparatus for converting analog signals in optical instruments to digital signals representative of a feature in a sample of interest. The apparatus according to the invention comprises a reference signal detection circuit amd a true signal detection circuit, each including an integrator and a plurality of switches controlled by a programmer to sequence respective signal integrations. The true signal detection circuit includes a true signal detector which provides an output signal indicative of a sample, means for inverting that analog signal, and means for integrating either the detected signal or an inverted blanking signal for predetermined periods of time. The reference signal detection circuit includes an integrator for integrating the detection signal for a predetermined period of time. The programmer controls the operation of the respective integrators so that (1) during the discharge cycle both the reference signal integrator and the true signal integrator are discharged to a predetermined reference or zero level; (2) during a zero blanking cycle, the reference signal integrator remains at its predetermined reference or zero level while the true signal integrator integrates an inverted blanking signal; (3) during a measuring cycle, the reference integrator integrates the reference signal while the true signal integrator integrates the true signal relative to the charge previously stored on the integrator during the blanking cycle; and (4) during a de-integration cycle, the integrated reference signal is used to discharge the true signal integrator so as to cause the de-integration time to be proportional to the ratio of the true signal to the reference signal. In an alternative embodiment, the reference signal detector is replaced with a fixed voltage for comparison during the de-integration cycle.

The method according to the invention comprises the steps of discharging a reference signal integrator and a true signal integrator in a circuit wherein the integrators are respectively connected to receive an analog output from the reference signal detector and the true signal detector; integrating a blanking signal in a true signal detection circuit by inverting an analog blank signal for a predetermined period of time; integrating the output of a reference signal detector and a true signal detector for a predetermimed period of time in a reference signal integrator and a true signal integrator; and de-integrating the true signal integrator with the output of the reference integrator to produce a digital count proportional to their ratio.

These and other features of the invention will become apparent from the written description of the invention which follows.

DETAILED DESCRIPTION OF THE PREFERRED EMBODIMENT

Figure 1:
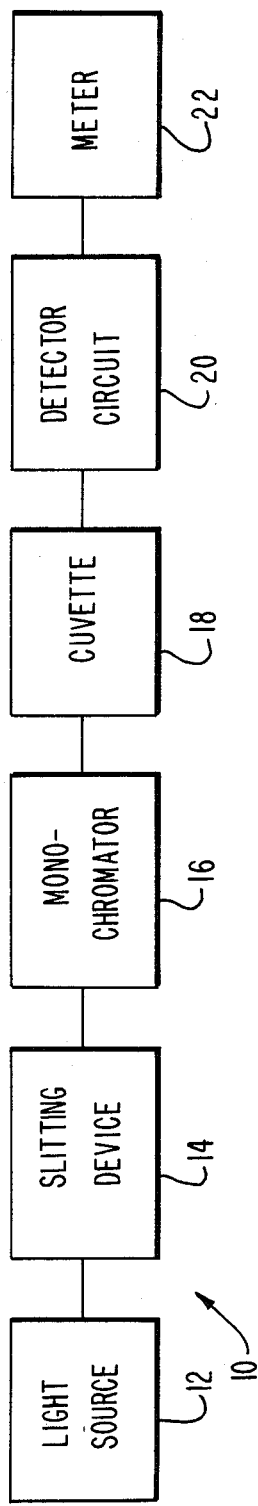
FIG. 1 is a block diagram of a single beam spectrophotometer known to the art, for purposes of illustrating the features of the invention.
Figure 2:
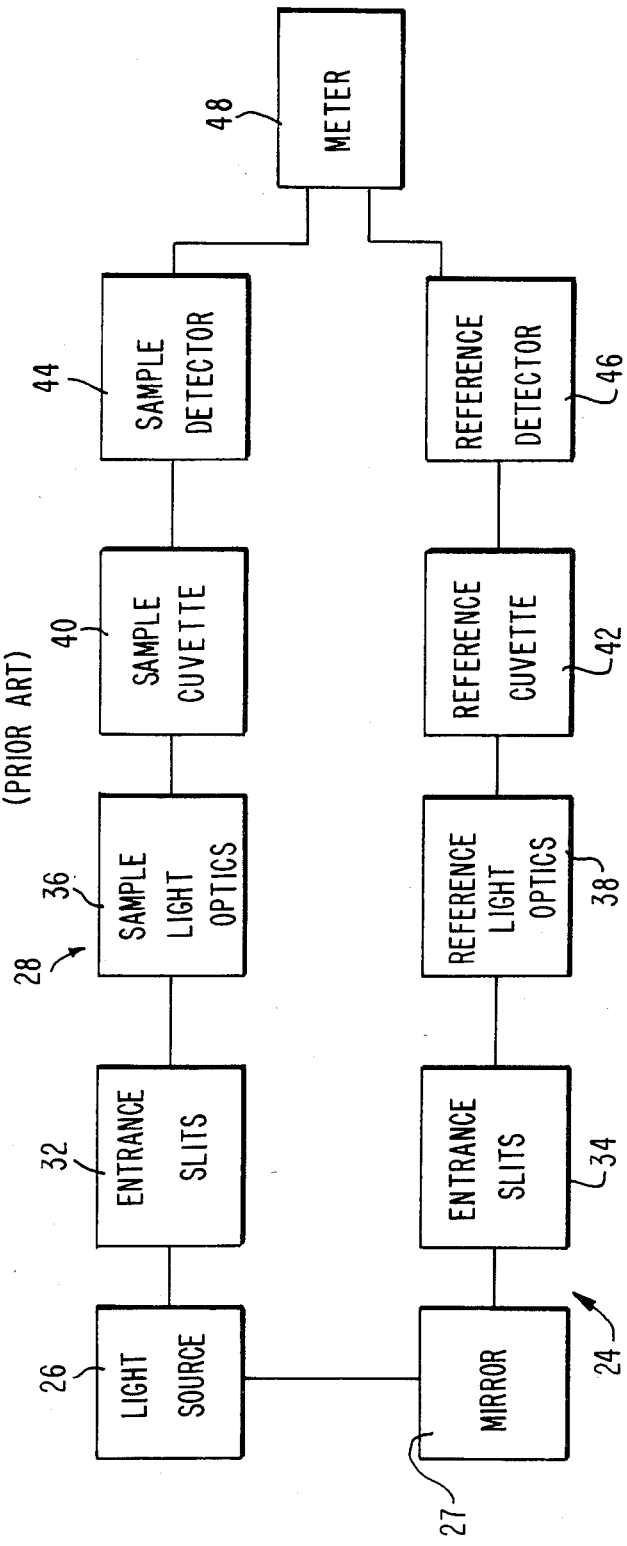
FIG. 2. is a block diagram of a dual beam nephelometer for further understanding the optical detection circuit according to the invention.

FIGS. 1 and 2 show, for purposes of understanding the invention, examples of two types of known instruments, in block format, for photometric analysis. Thus, FIG. 1 shows the basic components of a single beam spectrophotometer for measuring light intensity in a narrow wavelength range of the spectrum selected for an instrument. Such an instrument is exemplary of photometric instruments for measuring light intensity. The spectrophotometer shown in FIG. 1 is designated by the reference numeral 10 and includes a light source 12, an entrance slitting device 14, and a monochromator 16 providing a source of light to a sample in a cuvette 18 which provides an output signal to a detector circuit 20, the intensity of which is measured by appropriate instrumentation 22. Light from the light source 12 thus enters the monochromator 16 from a well defined point for resolution into various wavelengths in a system of prisms or gratings in the monochromator 16. An exit slit may be used to control the beam of incident light that passes to the analytical cell or cuvette 18 which holds the solution whose absorption is to be measured. The emergent light from the cuvette is thus detected and its intensity measured to provide an output related to the concentration of a substance of interest. Such devices, with various modifications, are well known to the art and it is the combination of detection circuit 20 and the output instrumentation 22 to which this invention is applicable.

FIG. 2 is another example of a prior art photometric instrument known to the art in the form of a nephelometer 24 which utilizes a dual beam technique known to the art. Thus, a source of light 26 is provided to a true detection circuit 28 and to a reference detection circuit 30 through entrance slits 32 and 34 respectively to provide through optical devices 36 and 38 a source of incident light to a measured sample in a sample cuvette 40 and a reference sample in a reference cuvette 42. For example, when such devices are used for complex immunoassay, the optical system 28 accurately measures the forward scatter of incident light from a volume of liquid within the sample cuvette 40 to provide an output signal which is converted in a detector 44 having a suitable analog-to-digital conversion. It is known that the amount of light scattered by the sample in the cuvette 40 depends on the size of the scattering particles, their concentration, shape, wavelength of the light used, refraction indices of the particles and the medium in which they are suspended, and the angle at which the scatter is measured. From such data, the determination can be made, as is known in the art, of the concentration of interest in the sample.

The reference optical circuit 30 provides a reference source for comparision with the scattered light based upon light from the same source 26 reflected by a mirror 27. The incident light from the reference optical source 38 is passed through a standard sample containing known constituents in a cuvette 42 for detection of the emergent light from the standard sample in a detector 46 and, if desired, a ratio of the outputs of the detectors 44 and 46 may provide an output signal on a meter 48 of interest to the investigator. Nephelometers are known to the art utilize such basic principles in varying formats with varying degrees of complexity, hardware, sample handling techniques, and electronics. It is to the output section of such a nephelometer that the method and apparatus according to this invention, as will be described in greater detail below, are particularly applicable.

Figure 3:
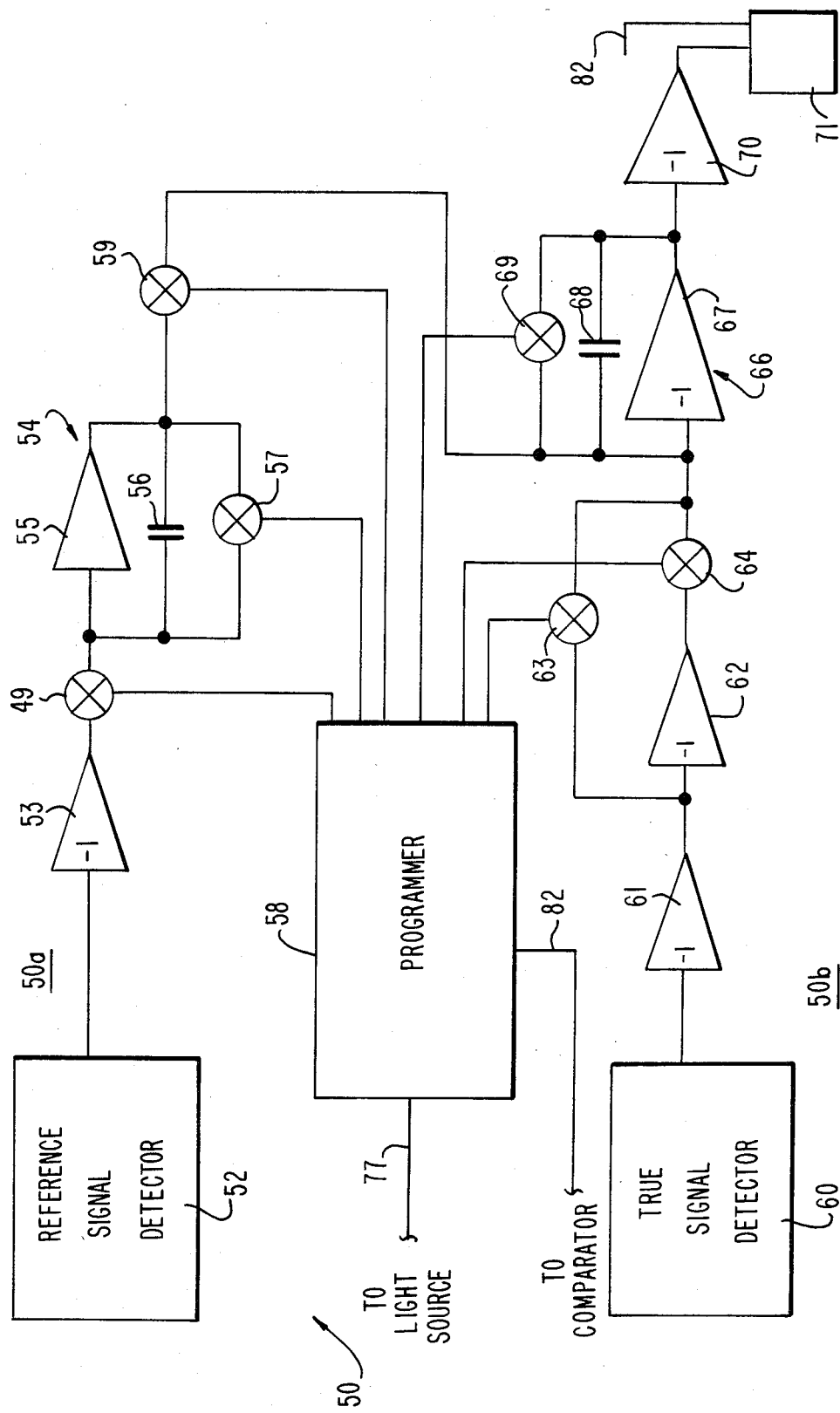
FIG. 3 is a block diagram of the optical detection circuit according to the invention utilized in conjunction with photometric instruments, for example, like those in FIGS. 1 and 2.

A measuring circuit according to the invention is shown in block diagram in FIG. 3 and is designated generally by the reference numeral 50, which includes a reference signal measuring circuit 50a and a true signal measuring circuit 50b. A reference signal detector 52 detects an analog signal representative of a quantity of emergent reference light from a photometric instrument such as either of the instruments shown in FIGS. 1 and 2 to provide an analog output signal representative of the intensity of that reference signal. An output signal from the reference signal detector 52 may optionally be amplified in an amplifier 53 and the amplified analog signal provided through a controlled switch 49 to a reference signal integrator 54 comprising an operational amplifier 55 having an integrating capacitor 56 connected between its input and its output and a control switch 57 connected across the capacitor 56 and between the input and the output of the operational amplifier 55. A programmer 58 controls the sequence of operation of the circuit 50 by, among other things, controlling the operation of a plurality of control switches, such as transistors and, in particular, control switch 57. When the control switch 57 is open and the switch 49 is closed, the integrator 54 integrates the reference input signal to the integrator. When the switch 49 is opened, the integrating capacitor is bypassed so that no further integration occurs. The output from the reference signal integrator 54 is controllably provided to the true signal detection circuit, as will be discussed, by operation of a switch 59 controlled by the programmer 58.

The true detection circuit 50b includes a true signal detector 60 which provides an analog signal representative of the intensity of light passing through a sample of interest to the investigator. The output signal from the true signal detector 60 is amplified in an analog amplifier 61 to provide an input to an inverter 62. A switch 63, controlled by the programmer 58, selectively and controllably bypasses the inverter 62. In addition, a controlled switch 64 is connected to the output of the inverter 62 for controllably providing an inverted analog output signal from the inverter 62 to the input of a true signal integrator 66. The true signal integrator 66 includes an operational amplifier 67 having a true signal integrating capacitor 68 connected between its input and output and in parallel with a control switch 69 controlled by the programner 58. The output from the true signal integrator 66 is provided to a comparator 70 in circuit with a counter 71. The specific circuit elements used to achieve the purposes and functions of this invention are known to those skilled in the art.

Figure 4:
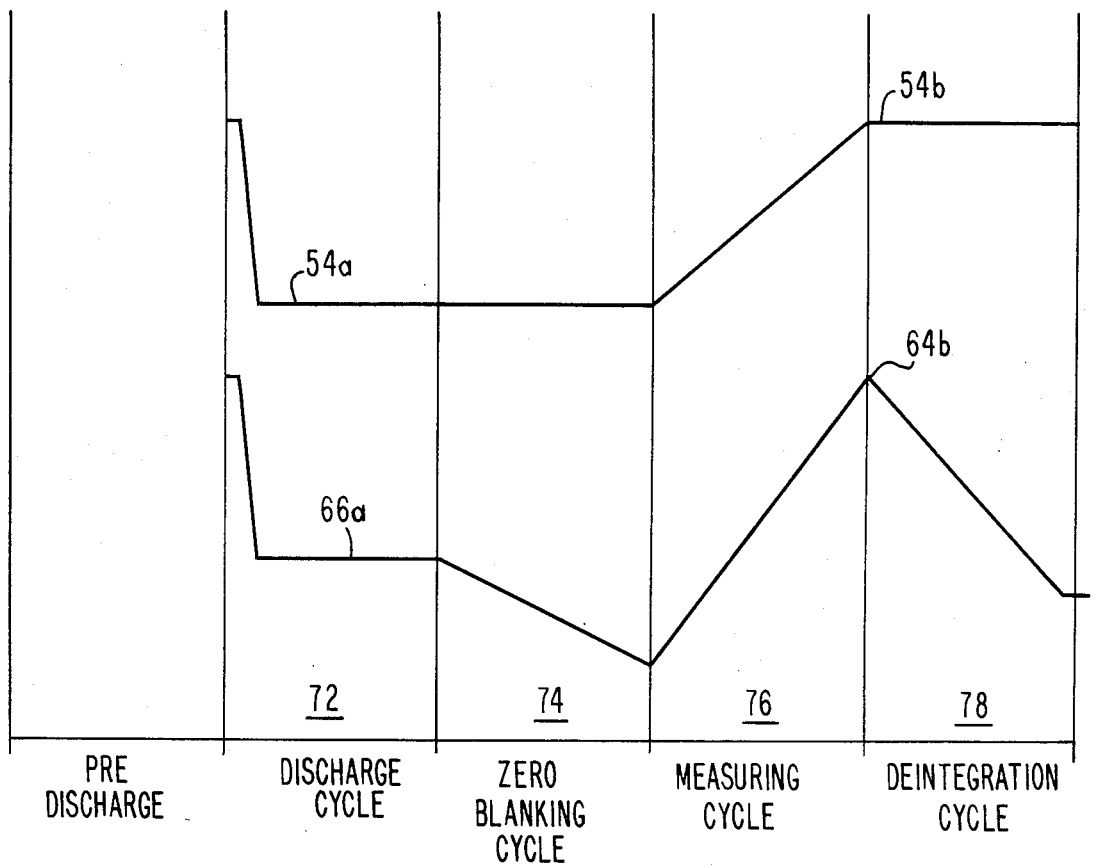
FIG. 4 is a timing diagram for the circuit of FIG. 3 showing respectively the discharge cycle, a zero blanking cycle, a measuring cycle, and a deintegration cycle.

The programmer 58 thus establishes the timing sequence for the components in FIG. 3 as shown in the timing diagram of FIG. 4. Thus, the programmer 58 controls the circuit 50 through a discharge cycle 72, a zero blanking cycle 74, a measuring cycle 76, and a de-integrating cycle 78 during which counting occurs. In FIG. 4, therefore, the output signal from the reference integrator 54 is shown by the upper curve in FIG. 4, designated generally by the reference numeral 54a, while the output from the integrator 66 is shown by the lower curve 66a during the particular cycles noted.

The sequence controlled by the programmer 58 begins of interest at the beginning of the discharge cycle 72 designated by the reference numeral 72 at which time the discharge switch 57 is closed permitting the charge on the capacitor 56 to discharge the reference integrator 54 and at the same time closing the switch 69 to discharge the capacitor 68 on the true signal integrator 66. Thus, the charge existing on the capacitor 56 in the reference signal detection circuit 50a whether as a result of the initial startup or residual charge accumulated by the instrument at rest, or from a prior cycle or by drift or the like, is caused to discharge to a nominal reference level, or preferably to a zero level as shown by the curve 54a during the discharge cycle 72. Similarly, the capacitor 68 in the true signal integrator 66 is discharged so that the reference signal integrator 54 and the true signal integrator 66 are both reset to a reference or the zero level and prepared to analyze the reference signal and the true signal from emergent light from a reference sample and a sample of interest respectively.

At the end of the discharge cycle 72, the programmer 58 causes the circuit to operate in a zero blanking cycle 74. During the zero blanking cycle, the switch 57 remains closed and the switch 59 remains open so that the output from the reference signal integrator 54 remains at its reference or zero level. During the zero blanking cycle 74, the switch 64 is closed by the programmer 58 so that an inverse of the detected true analog signal from the true signal detector 60 is provided to the true signal integrator 66. The switch 69 remains opened by the programmer 58 so that the integrator 66 integrates the blank signal or true signal detector during the zero blanking cycle to a level shown by the curve 66a.

At the close of the zero blanking cycle 74, the programmer 58 causes the circuit to operate in the measuring cycle 76. During the measuring cycle 76, the programmer may actuate the light source or a shutter by a signal on the lead 77 and opens the switch 57, while switches 59 and 69 remain open so that the analog reference signal from the reference signal detector 52 and the true analog signal from the detector 60 are respectively integrated by the reference signal integrator 54 and the true signal integrator 66. During the measurement cycle, the switch 64 is opened, while the switch 63 is closed so that the true analog signal is provided as the input to the integrator 66. During this period, the signal at the output of the reference signal integrator 54 as shown by the curve 54a reaches a reference signal value 54b while the signal at the output of the true signal integrator 66 reaches a value 64b (representing the difference between the true signal and stray light and the blanking signal, i.e. the true scatter signal alone) as shown in FIG. 4.

At the close of the measuring cycle, the programmer 58 commands a de-integration cycle wherein the switch 57 remains open, the switch 59 is closed, the switch 69 remains open, the switch 64 remains open, and the switch 63 is opened. During the de-integration cycle 78, the true signal integrator 66 and the reference signal integrator 54 are discharged to provide an input to a comparator 70 which is representative of the difference between the integrated reference signal and the integrated true signal. At the same time, the operation of the counter 71 is commanded by the programmer 58 by a signal on lead 82 to provide a comparator controlled count wherein the number of counts is representative of the ratio between the difference of the integrated detected signal and the integrated blank signal divided by the reference signal.

Figure 5:
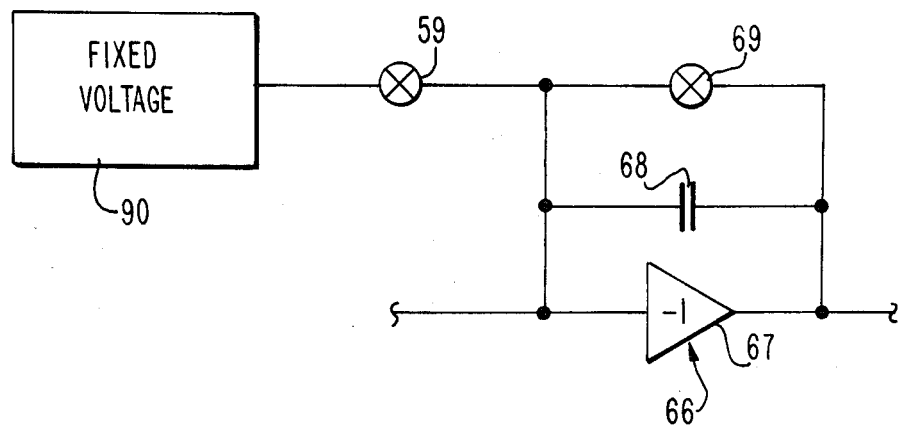
FIG. 5 is an alternative embodiment of a portion of the reference signal detection circuit of FIG. 3.

FIG. 5 shows an alternative embodiment of a portion of the circuit of FIG. 4 in which the reference detection circuit 50a is eliminated in favor of a fixed voltage source 90 connected to the control switch 59 to provide the input during the de-integration cycle 78 to the true signal integrator 66. In that case, the true detector output can be read directly when a fixed voltage is used for de-integration.

Preferably the zero blanking cycle 74 and the measuring cycle 76 are determined to be of equal value and related to the frequency of the primary sources of noise. In a ratioing nephelometer, for example, the primary sources of noise are 60 Hz electrical noise and 120 Hz fluorescent lamp interference. Thus, a 33.33 ms integration time corresponding to two 60 Hz cycles is preferably chosen so that optimum operation is achieved when the integration time coincides with a multiple of the primary interference frequency.

The circuit shown in FIGS. 4-6 has significant advantages in improving the basic signal to noise ratio through time integration of both the detected signal and a reference signal while providing a high precision analog-to-digital conversion of the integrated signal or ratioed signal. In addition, the circuit exhibits superior interference rejection characteristics because of the time cycle. Thus, the circuit according to the invention can be applied to any instrument for photometric analysis, including nephelometry, spectrophotometry, fluorimetry, and the like.

In applying the techniques of the invention, the best performance is achieved when zero blanking is performed to invert the blank signal and to integrate that signal. Such a zero blanking cycle in effect subtracts an inverted residual signal so that the initial signal on the true signal integrator is accurately controlled to an effective zero starting point by providing a subtractive signal representative of residual light.

Where the light source in the photometric instrument is a fast response lamp, such as a light emitting diode and flash lamp, electronic modulation of the light source, for example, the under the control of the programmer 58, may be used. For slow response lamps, such as tungsten filament bulbs and the like, mechanical shutters may be used.

This invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. In an optical detection circuit for converting an analog signal into a digital representation of that signal and comprising a reference signal detection means for detecting a reference signal and a true signal detection means for detecting a signal from a sample of interest, the improvement comprising:

a true signal integrator for integrating an analog signal from said true signal detection means upon command, inversion means for inverting an output signal from said true signal detection means during a zero blanking cycle and programming means for programming the operation of said true signal integration means through (a) a discharge cycle wherein the residual charge on said integration means is discharged to a reference level; (b) during a zero blanking cycle wherein the output from said inversion means is provided to the input of said integration means for integrating a blanking signal; (c) during a measuring cycle wherein an analog output from said true signal detection means is integrated by said integration means while inhibiting a signal from said inversion means; and (d) during a de-integration cycle in which the output of said integration means is representative of the difference between said true analog signal and said blanking signal.

2. The improvement as set forth in claim 1, further comprising a reference signal circuit for providing a reference signal to said integration means of said true signal detection circuit during said de-integration cycle.

3. The improvement as set forth in claim 2, wherein said reference signal detection circuit includes a reference signal detector and a reference signal integrator for integrating an analog output from said reference signal detector means during said measuring cycle, and providing a signal representative of said integrated reference analog signal to said true signal integration means during said de-integration cycle.

4. The improvement as set forth in claim 3, further including a comparator connected in circuit with the output of said true signal integrator.

5. The improvement as set forth in claim 3, further including a digital counter in circuit with the output of said integrator and programmed to count pulses during said de-integration cycle.

6. The improvement as set forth in claim 2, wherein said reference signal detection circuit includes a fixed voltage source in circuit with said reference signal detector.

7. The improvement as set forth in claim 2, wherein said reference signal integrator is programmed to discharge to a reference signal level during said discharge cycle, and to integrate said reference analog signal during said measuring cycle.

8. In an apparatus for converting a reference analog signal and a true analog signal into a digital representation indicative of said true signal of the type including a reference detection means for detecting a reference signal, and a true signal detection means for detecting a true signal, and an output circuit for providing a digital representation of the magnitude of said true analog signal relative to said reference signal, the improvement comprising:

a reference signal integration means for integrating said reference analog signal upon command;

a true signal integration means for integrating said true analog signal on command; and program means for commanding the operation of said reference signal integration means and said true signal integration means (a) during a discharge cycle in which charge stored on either of said integration means is discharged to a reference level; (b) during a measuring cycle in which said reference signal integration means integrates the reference analog signal while said true signal integration means integrates said true analog signal; and (c) during a de-integration cycle wherein said reference signal integration means de-integrates the signal obtained during said measuring cycle on said true analog signal detector.

9. The improvement as set forth in claim 8, wherein inversion means for providing an inverted zero blanking signal to said integration means is in circuit with said true signal analog detector and said true signal integrator and commanded by said program means to integrate an inverted zero blanking signal during a zero blanking cycle preceding said measuring cycle.

10. The improvement as set forth in claim 8, wherein the length of each of said cycles is a predetermined multiple of a primary source of interference noise.

11. A method for performing an A/D conversion in an optical circuit of the type including means for detecting an analog reference signal, and means for detecting an analog true signal, means for respectively integrating said analog reference signal and said analog true signal and means for providing an output representative of the ratio between said integrated analog reference signal and said integrated true signal, the method comprising the steps of:

discharging said analog reference signal integrator while discharging said analog true signal integrator;

simultaneously integrating during a measuring cycle said analog reference signal and said analog true signal in said analog reference signal integrator and said analog true signal integrator and de-integrating the integrated signal on said analog true signal integrator with the output of the integrated reference signal integrator thereby producing an output whose time duration is proportional to the ratio of the two signals; and means for counting a number of pulses during said de-integration cycle to provide a digital representation of the magnitude of said ratio.

12. The method as set forth in claim 11, wherein the length of each of said discharge cycle, said measuring cycle, and said de-integration cycle is a predetermined multiple of a frequency of a source of primary interference.

13. The method as set forth in claim 12, further including the steps of integrating during a zero blanking cycle a zero blanking signal prior to said measuring cycle.

* * * * *